(12) United States Patent
Zheng et al.

(10) Patent No.: US 10,330,978 B2
(45) Date of Patent: Jun. 25, 2019

(54) LIGHT EMISSION ASSEMBLY OF BACKLIGHT MODULE, BACKLIGHT MODULE AND DISPLAY DEVICE

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventors: Zhifu Zheng, Beijing (CN); Li Wang, Beijing (CN); Daowen Xi, Beijing (CN)

(73) Assignees: BOE TECHNOLOGY GROUP CO., LTD., Beijing (CN); K-TRONICS (SUZHOU) TECHNOLOGY CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 15/574,678

(22) PCT Filed: Jun. 1, 2017

(86) PCT No.: PCT/CN2017/086879
§ 371 (c)(1),
(2) Date: Nov. 16, 2017

(87) PCT Pub. No.: WO2017/211224
PCT Pub. Date: Dec. 14, 2017

(65) Prior Publication Data
US 2018/0252965 A1    Sep. 6, 2018

(30) Foreign Application Priority Data
Jun. 7, 2016   (CN) .......................... 2016 1 0403665

(51) Int. Cl.
*G02F 1/135* (2006.01)
*G02F 1/1335* (2006.01)
*G02B 27/09* (2006.01)
*G02B 19/00* (2006.01)
*H01L 25/075* (2006.01)
*H01L 33/58* (2010.01)
*H01L 33/60* (2010.01)

(52) U.S. Cl.
CPC ... *G02F 1/133603* (2013.01); *G02B 19/0014* (2013.01); *G02B 19/0061* (2013.01);
(Continued)

(58) Field of Classification Search
CPC ......... G02F 1/133606; G02F 1/133611; G02F 2001/133607
(Continued)

(56) References Cited

U.S. PATENT DOCUMENTS

2010/0012944 A1   1/2010   Cho et al.
2010/0061096 A1   3/2010   Sato
(Continued)

FOREIGN PATENT DOCUMENTS

CN   101375095 A   2/2009
CN   101515612 A   8/2009
(Continued)

OTHER PUBLICATIONS

The Second Chinese Office Action dated Jul. 31, 2013; Appln. No. 201610403665.6.
(Continued)

*Primary Examiner* — William J Carter
(74) *Attorney, Agent, or Firm* — Ladas & Parry LLP

(57) ABSTRACT

A light emission assembly of a backlight module, a backlight module and a display device are provided and relate to a display technical field. The light emission assembly includes a circuit board and at least one light emission unit provided thereon, the light emission unit includes a light source, a light absorption element is provided on the circuit board, and the light absorption element is provided around the light source.

20 Claims, 6 Drawing Sheets

(52) U.S. Cl.
CPC ..... *G02B 27/0955* (2013.01); *G02B 27/0977* (2013.01); *G02F 1/133605* (2013.01); *G02F 1/133608* (2013.01); *H01L 25/0753* (2013.01); *G02F 2001/1351* (2013.01); *H01L 33/58* (2013.01); *H01L 33/60* (2013.01)

(58) Field of Classification Search
USPC .......................................................... 362/97.1
See application file for complete search history.

(56) References Cited

U.S. PATENT DOCUMENTS

2013/0050989 A1* 2/2013 Shen ................. G02F 1/133602
362/97.1
2013/0070170 A1* 3/2013 Namekata ......... G02F 1/133603
348/836

FOREIGN PATENT DOCUMENTS

| | | |
|---|---|---|
| CN | 102494264 A | 6/2012 |
| CN | 203363994 U | 12/2013 |
| CN | 203431583 U | 2/2014 |
| CN | 203658711 U | 6/2014 |
| CN | 104534417 A | 4/2015 |
| CN | 204404074 U | 6/2015 |
| CN | 105892149 A | 8/2016 |
| CN | 205665499 U | 10/2016 |

OTHER PUBLICATIONS

International Search Search Report and Written Opinion dated Aug. 25, 2017; PCT/CN2017/086879.

* cited by examiner

LIGHT EMISSION ASSEMBLY OF BACKLIGHT MODULE, BACKLIGHT MODULE AND DISPLAY DEVICE

TECHNICAL FIELD

At least one embodiment of the present disclosure relates to a light emission assembly of a backlight module, a backlight module and a display device.

BACKGROUND

A liquid crystal display device, for example, a television, typically comprises a display panel and a backlight module, and the backlight module is used for providing backlight for the display panel. Depending on different locations of a light source in the backlight module, the backlight module is classified into a backlight module of side-lit type and a backlight module of direct-lit type. In the backlight module of direct-lit type, a plurality of light sources are evenly distributed on a non-display side of the display panel.

SUMMARY

Embodiments of the present disclosure provide a light emission assembly of a backlight module, a backlight module and a display device, so as to weaken or eliminate a bright spot in light shadow, and enhance an overall quality of an image.

At least one embodiment of the present disclosure provides the light emission assembly of the backlight module, which comprises: a back plate, at least one light emission unit, provided on the back plate, the light emission unit including a light source, a light absorption element, provided on the back plate, the light absorption element being provided around the light source.

At least one embodiment of the present disclosure provides the backlight module, which comprises the light emission assembly as described above.

At least one embodiment of the present disclosure provides the display device, which comprises the backlight module as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

01—display panel; 02—back plate; 03—printed circuit board; 04—light emission unit; 05—bright spot in light shadow; 06—reflective paper; 10—circuit board; 20—light emission unit; 201—light source; 30—light absorption element, 202—lens, 2020—lens mounting portion, 40—reflective layer, 301—first sub-light absorption element, 302—second sub-light absorption element, 303—third sub-light absorption element.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

In a backlight module of direct-lit type, there is no cost competitive advantage if using multiple optical films. In order to reduce the cost, more companies use a single optical film or do not use any optical film. In a case where a single optical film is used or no optical film is used, problems of poor shielding effect and heavy bright spot in light shadow are brought about; and in order to overcome these problems, a higher technical requirement is put forward for the backlight module.

Figure 1A:
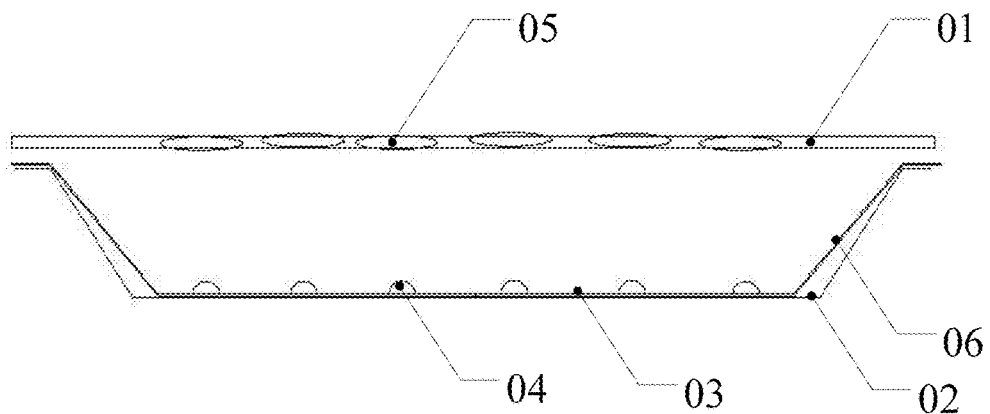
FIG. 1a is a schematic view illustrating a bright spot in light shadow presented in a display device according to one technique.
Figure 1B:
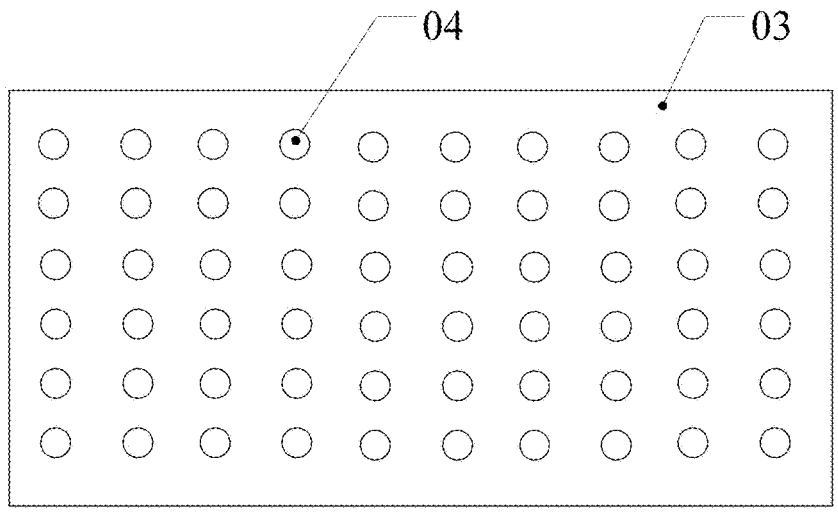
FIG. 1b is a top schematic view illustrating a light emission assembly of the display device according to one technique.

FIG. 1a shows a display device having the backlight module of direct-lit type, a non-display side of a display panel 01 is provided with a back plate 02, a printed circuit board 03 is provided inside the back plate 02, and a plurality of light emission units 04 are uniformly distributed on a surface of the printed circuit board 03 facing the display panel 01. In FIG. 1a, an upper side of the display panel 01 is a display side, a lower side of the display panel 01 is the non-display side, and the display side is opposite to the non-display side. FIG. 1a only shows the light emission units 04 at a cross section. FIG. 1a also shows a bright spot 05 in light shadow. A reflective paper 06 for example is further provided inside the back plate 02. FIG. 1b shows a top-view schematic view illustrating a light emission assembly of the display device. The light emission assembly of the display device comprises a printed circuit board 03 and the plurality of light emission units 04 provided on the printed circuit board 03.

Figure 2A:
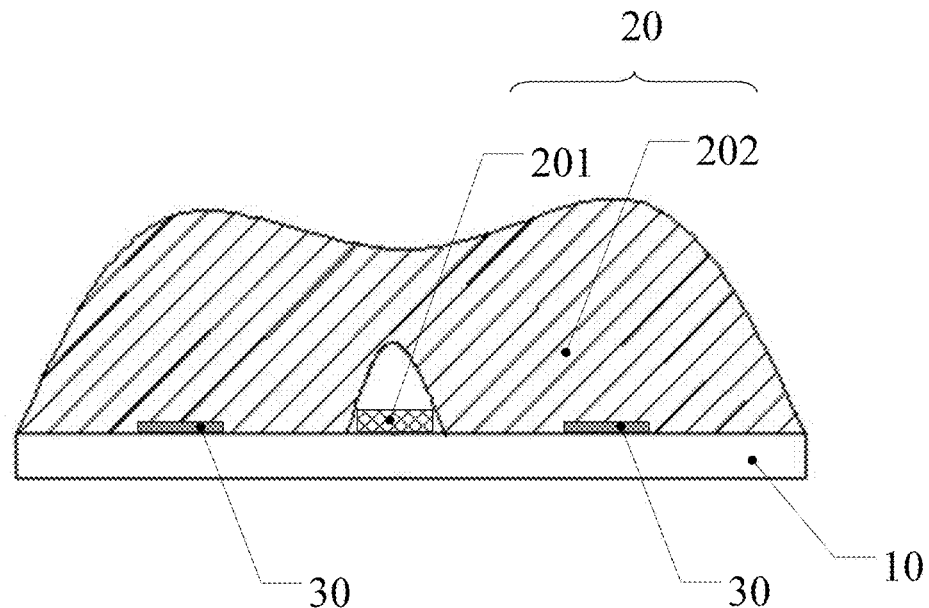
FIG. 2a is a schematic view illustrating a light emission assembly provided by embodiments of the present disclosure.

At least one embodiment of the present disclosure provides a light emission assembly of a backlight module. As shown in FIG. 2a, the light emission assembly comprises a back plate such as a circuit board 10 and at least one light emission unit 20 provided on the circuit board 10, the light emission unit 20 includes a light source 201, the circuit board 10 is provided thereon with a light absorption element 30, the light absorption element 30 is provided around the light source 201, and the light absorption element 30 is configured to absorb a portion of light at a central portion of the light emission unit 20 to weaken light emission intensity at the central portion of the light emission unit 20. It should be noted that, FIG. 2a only shows one light emission unit 20 on the circuit board 10, and a plurality of light emission units may be provided on the circuit board 10 and the structures thereof may be referred to the light emission unit 20 shown in FIG. 2a. The light absorption element 30 is configured to absorb a portion of light at the central portion of the light emission unit 20. The central portion refers, for example, to a region in which a light emission angle is in a range of −40° to 40°; and furthermore, for example, the central portion refers, for example, to a region in which the light emission angle is in a range of −30° to 30°, but is not limited thereto. The central portion refers to a region with large light emission intensity, a region whose light emission intensity needs to be weakened to obtain smaller light emission intensity difference.

Because the light emission intensity above the light source 201 is larger, there is a larger probability that a bright spot in light shadow appears on the display panel 01; in the embodiments of the present disclosure, by providing the light absorption element 30 on the circuit board 10 around the light source 201, a portion of light at the central portion of the light emission unit 20 is absorbed, which weakens the light emission intensity at the central portion of the light emission unit 20, so that light emission intensity difference between the central portion and an edge portion of the light emission unit is reduced. For example, the light emission intensity above the light source 201 is reduced to be consistent or substantially consistent with the light emission intensity at the edge portion of the light emission unit, so as to weaken or eliminate the bright spot in light shadow of the display device, and enhance an overall quality of an image displayed by the display device.

For example, the light source 201 includes a light emission diode chip. The light emission diode chip herein refers, for example, to a packaged light emission diode chip. For example, the light emission angle of the light source 201 is 360°, and the light emission angle of the light source provided on the circuit board 10 is 180°, which is not limited thereto.

For example, the circuit board 10 includes a printed circuit board.

For example, a reflectivity of the light absorption element 30 is lower than a reflectivity at other positions of the circuit board 10 (that is, the reflectivity of the light absorption element 30 is lower than the reflectivity at other positions of the circuit board 10 where are not provided with the light absorption element 30). Thus, it is possible to absorb light and to weaken the light emission intensity at the central portion of the light emission unit, so that the light emission intensity difference between the central portion and the edge portion of the light emission unit is reduced. For example, the reflectivity of the light absorption element 30 is in a range of 5% to 80%; further, for example, the reflectivity of the light absorption element 30 is in a range of 5% to 50%; and further, for example, the reflectivity of the light absorption element 30 is in a range of 10% to 30%, which is not limited thereto.

Figure 2B:
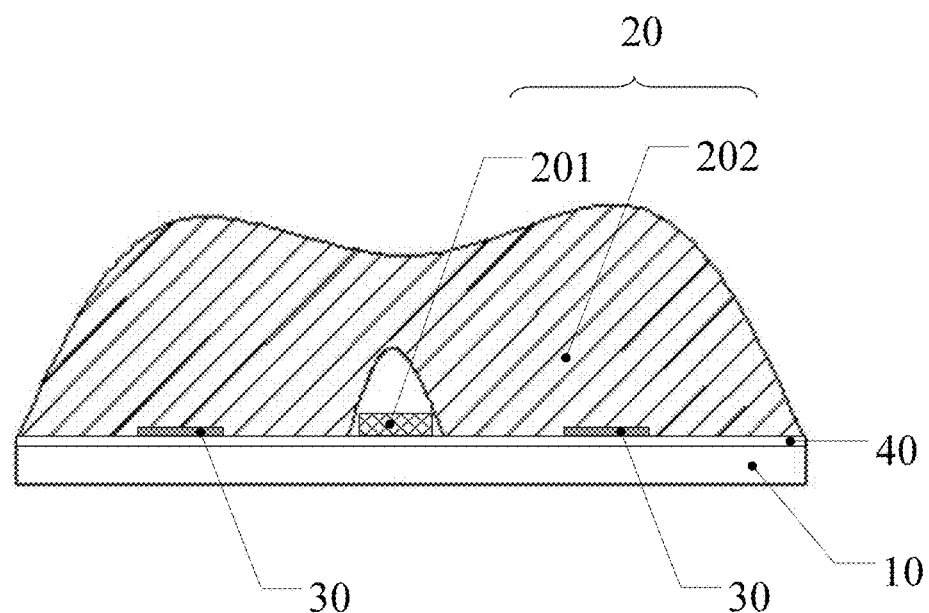
FIG. 2b is another schematic view illustrating the light emission assembly provided by the embodiments of the present disclosure.

As shown in FIG. 2b, in order to improve a light utilization rate, in some embodiments, the circuit board 10 is provided thereon with a reflective layer 40 such as a white reflective layer, and the light absorption element 30 is provided on the reflective layer 40. For example, a reflectivity of the reflective layer 40 is 98% or more, so that a higher light utilization rate is obtained. The reflective layer is, for example, a hydrated ink layer, but is not limited thereto.

Figure 3A:
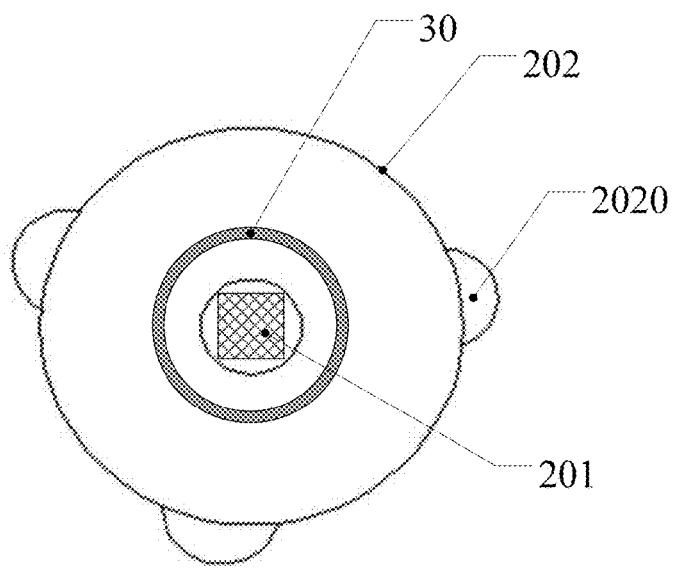
FIG. 3a is a top schematic view illustrating the light emission assembly provided by the embodiments of the present disclosure.

As shown in FIG. 2a and FIG. 2b, in some embodiments, the light emission unit 20 further includes a lens 202, and the lens 202 is fixed onto the circuit board 10 and provided outside the light source 201. For example, as shown in FIG. 3a, the lens 202 is bonded onto the circuit board 10 through a mounting portion 2020. For example, the lens 202 is a secondary optical lens. For example, the lens 202 includes a refractive lens, and light passing through the refractive lens is refracted by the refractive lens and then is emitted. For example, the light source 201 is located at a center of the lens. Arrangement of the lens 202 converges the light from the light source 201 and improves the light utilization rate; however, it should be noted that the lens may not be provided, which will not be limited in the embodiments of the present disclosure. After the refractive lens is provided, the light emission angle of the light emission unit for example is in a range of −80° to 80°. For example, light reaching the circuit board 10 (for example, including light emitted from the light source 201, light reflected by the lens, light reflected by an optical film, etc.) has a portion thereof absorbed by the light absorption element 30, which reduces the reflectivity at the position of the circuit board 10 where the light absorption element 30 is located, so it is possible to reduce the light emission intensity of the central portion of the light emission unit, so that the light emission intensity difference between the central portion and the edge portion of the light emission unit is reduced.

As shown in FIG. 2a, FIG. 2b and FIG. 3a, in some embodiments, an orthogonal projection of the light absorption element 30 on the circuit board 10 falls within an orthogonal projection of the lens 202 on the circuit board 10, and is located outside of an orthogonal projection of the light source 201 on the circuit board 10. Thus, the light emission intensity at the central portion of the light emission unit 20 is reduced, so that the light emission intensity difference between the central portion and the edge portion of the light emission unit is reduced.

As shown in FIG. 3a, in some embodiments, a shape of the light absorption element 30 is a closed ring provided around the light source 201, to weaken the light emission intensity at the central portion of the light emission unit 20. The closed ring is, for example, a circular ring, but is not limited thereto. For example, the light absorption element 30 is a circular ring with the light source 201 as a circle center.

In some embodiments, a light absorption rate of the light absorption element 30 is a constant value. That is, from a portion of the light absorption element 30 close to the light source 201 to a portion of the light absorption element 30 away from the light source 201, the light absorption rate of the light absorption element 30 is kept constant.

Figure 3B:
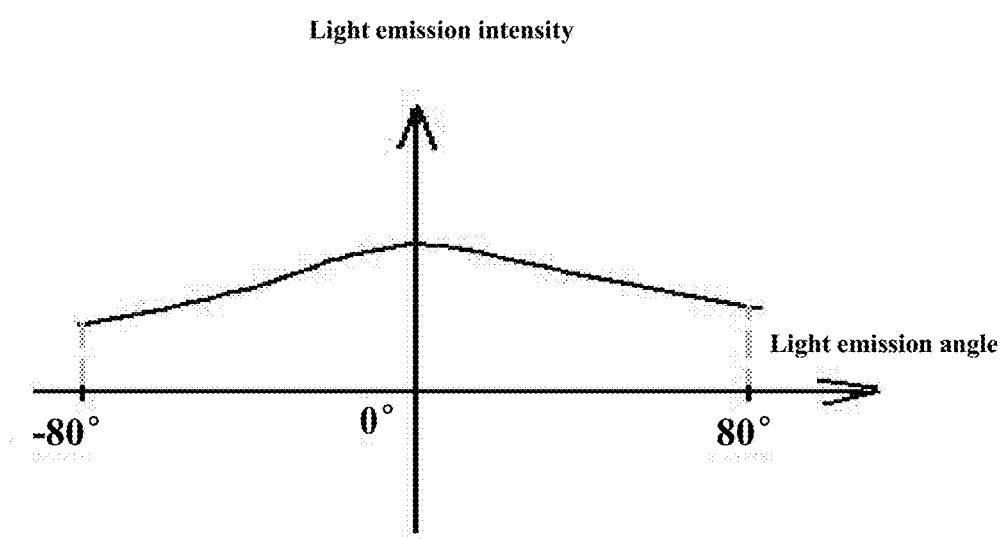
FIG. 3b is a schematic view illustrating a light emission intensity of the light emission assembly provided with a light absorption element at different light emission angles provided by the embodiments of the present disclosure.
Figure 3C:
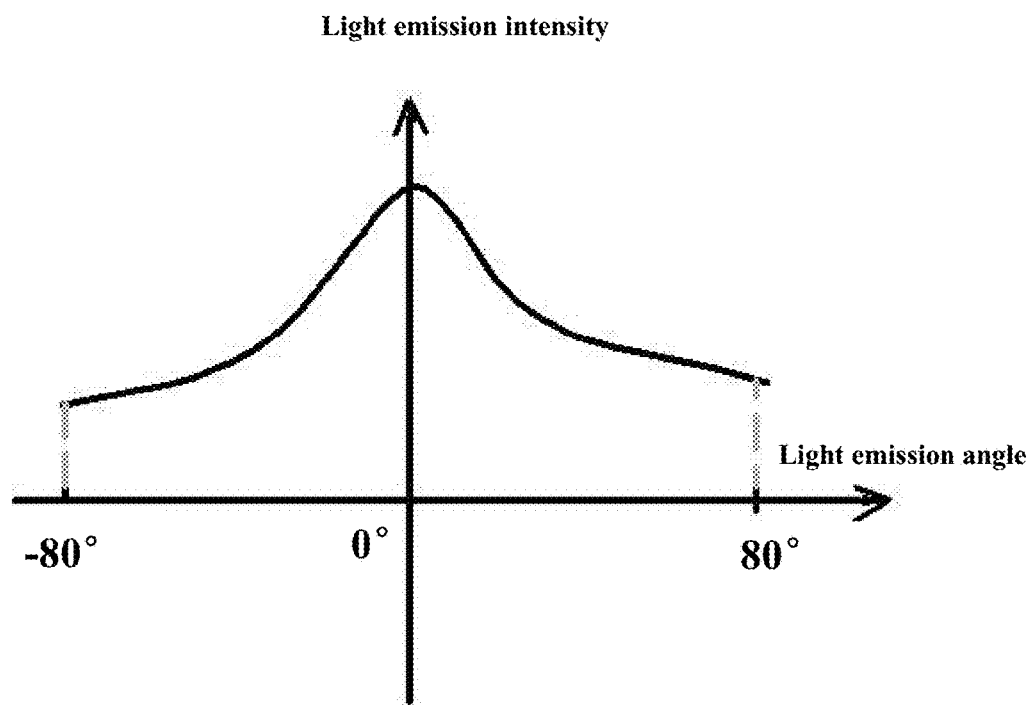
FIG. 3c is a schematic view illustrating a light emission intensity of a light emission assembly provided with no light absorption element at different light emission angles.

In some embodiments, the light source 201 is the light emission diode chip, the lens 202 is provided outside the light source 201, the reflective layer 40 is provided on the circuit board 10, the light absorption element 30 is provided on the reflective layer 40, the light absorption rate of the light absorption element 30 is the constant value, and the shape of the light absorption element 30 is the closed ring provided around the light source 201. In a case where the light absorption element 30 is provided, the light emission intensity curve of the light emission diode chip at different light emission angles are shown in FIG. 3b. In a case where the light absorption element 30 is not provided (except that the light absorption element 30 is not provided, other arrangements are the same as the case where the light absorption element 30 is provided), the light emission intensity curve of the light emission diode chip at different light emission angles are shown in FIG. 3c. As can be seen froth FIG. 3b and FIG. 3c, arrangement of the light absorption element 30 reduces the light emission intensity difference between the central portion and the edge portion of the light emission unit, which is conducive to improving the quality of the image. As can be seen from FIG. 3b and FIG. 3c as well, difference between the light emission intensity of the edge region in the case where the light absorption element 30 is provided and the light emission intensity of the edge region in the case where the light absorption element 30 is not provided is not large.

Figure 3D:
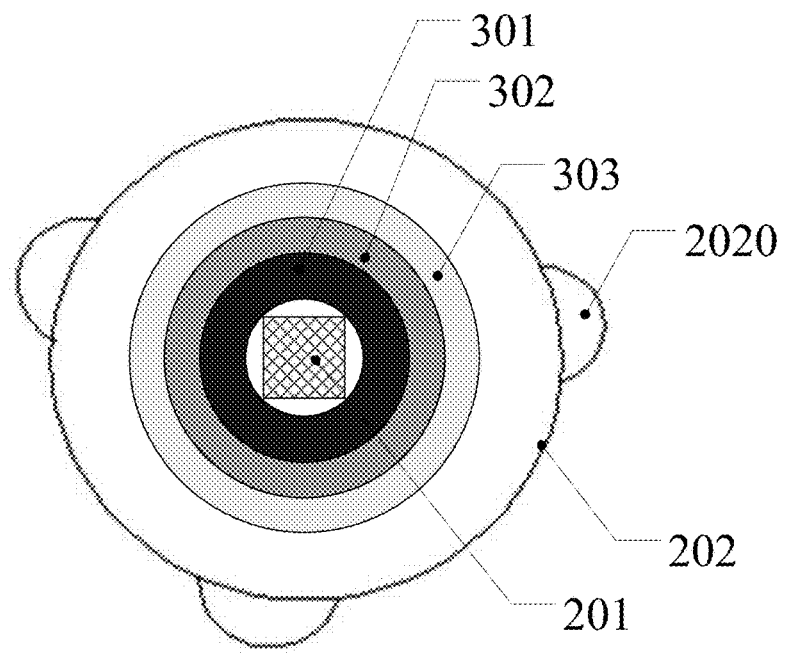
FIG. 3d is another top schematic view illustrating the light emission assembly provided by the embodiments of the present disclosure.

As shown in FIG. 3d, in some embodiments, the light absorption element 30 includes a plurality of sub-light absorption elements to weaken the light emission intensity at the central portion of the light emission unit 20. FIG. 3d shows a first sub-light absorption element 301, a second sub-light absorption element 302 and a third sub-light absorption element 303 sequentially provided in a direction away from the light source 201; and from a position close to the light source 201 to a position away from the light source 201, light absorption rates of the plurality of sub-light absorption elements of the light absorption element 30 gradually decrease. For example, a light absorption rate of each sub-light absorption element is a constant value. For example, the plurality of sub-light absorption elements have their material to be the same and have their light absorption rates to be a constant value at a same radius with the light source as a circle center. For example, the light absorption element 30 includes at least one of a black substance, a brown substance, a blue substance, and a gray substance, which is not limited thereto. For example, the first sub-light absorption element 301 is the black substance, the second sub-light absorption element 302 is the brown substance, and the third sub-light absorption element 303 is the gray matter, which is not limited thereto. It should be noted that, the number of sub-light absorption elements is not limited to the above-described examples.

Figure 4A:
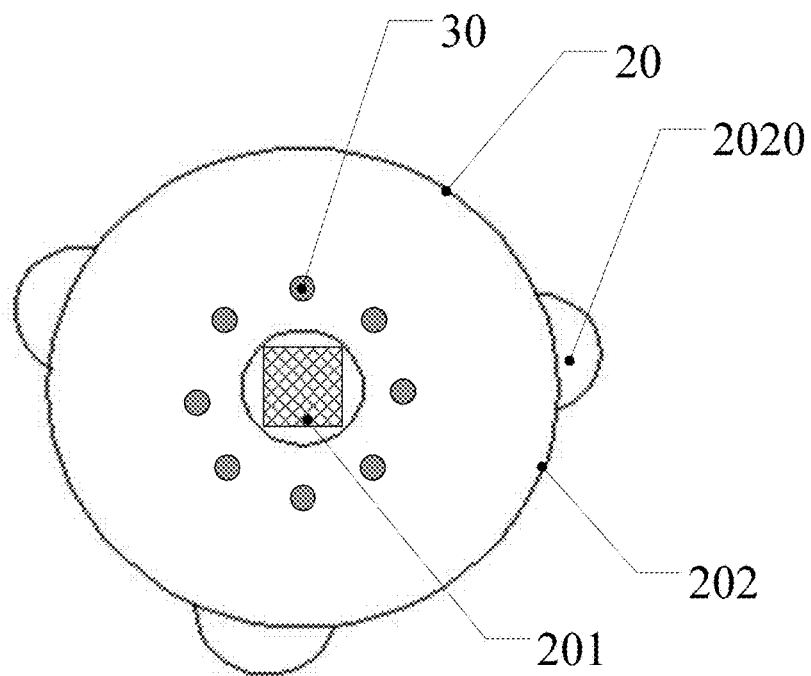
FIG. 4a is a top schematic view illustrating that the light emission assembly comprises a plurality of discrete portions provided by the embodiments of the present disclosure.
Figure 4B:
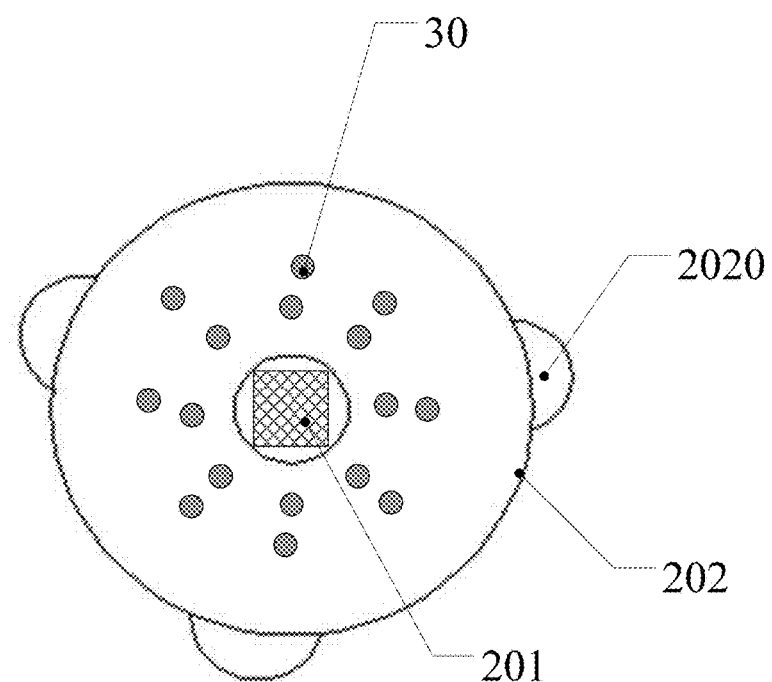
FIG. 4b is another top schematic view illustrating that the light emission assembly comprises a plurality of discrete portions provided by the embodiments of the present disclosure.
Figure 4C:
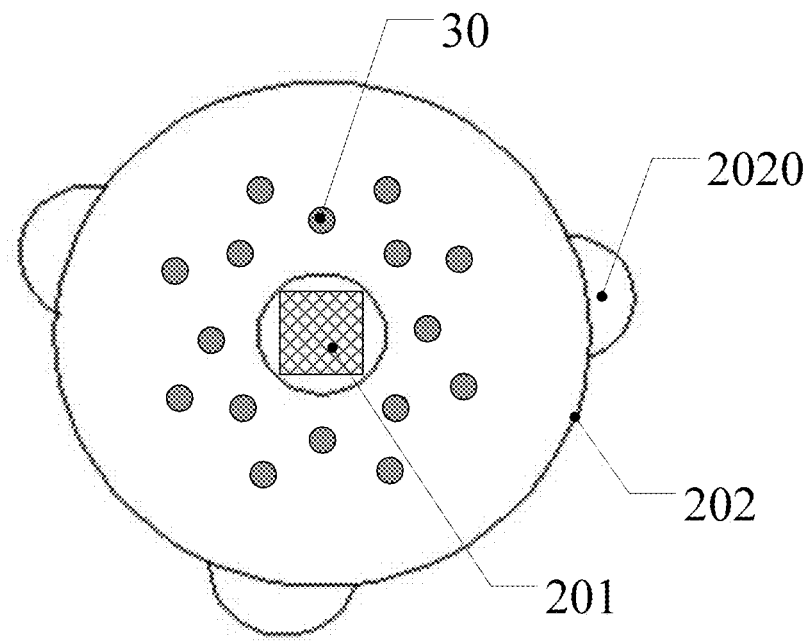
FIG. 4c is still another top schematic view illustrating that the light emission assembly comprises a plurality of discrete portions provided by the embodiments of the present disclosure.
Figure 4D:
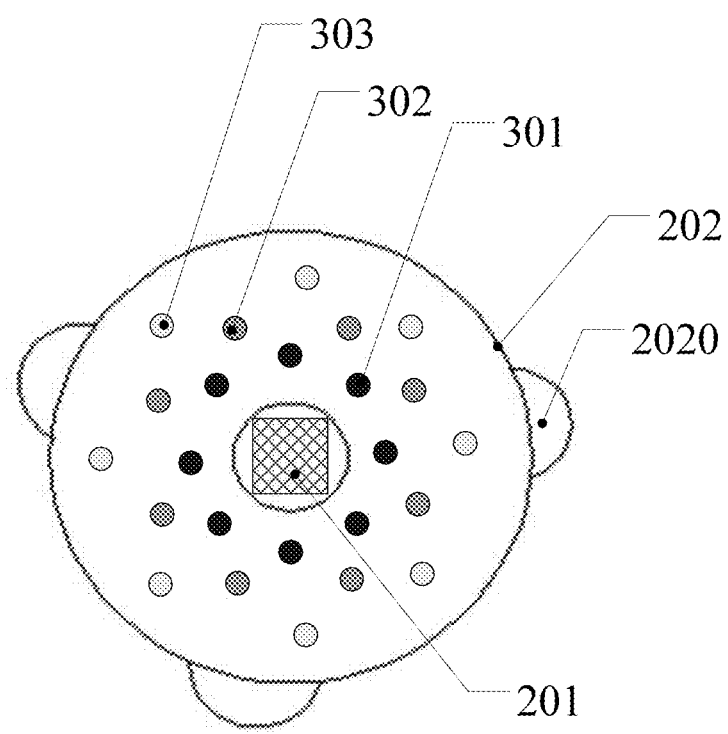
FIG. 4d is still another top schematic view illustrating that the light emission assembly comprises a plurality of discrete portions provided by the embodiments of the present disclosure.

As shown in FIG. 4a, in some embodiments, the light absorption element 30 includes a plurality of discrete portions provided around the light source 201, to weaken the light emission intensity at the central portion of the light emission unit 20. For example, the light absorption element 30 has a pattern as shown in FIG. 4b and FIG. 4c. As shown in FIG. 4b, the plurality of discrete portions are radially arranged around the light source 201 in a ray pattern. As shown in FIG. 4c, the plurality of discrete portions are evenly arranged. For example, the plurality of discrete portions are evenly arranged in a range of a circular ring surrounding the light source 201. For the structures shown in FIG. 4b and FIG. 4c, in some embodiments, the light absorption rates of the plurality of discrete portions are equal to each other. In other embodiments, the light absorption rates of the plurality of discrete portions are unequal to each other, each discrete portion is a sub-light absorption element, and for example, from the position close to the light source 201 to the position away from the light source 201, the light absorption rates of the plurality of discrete portions of the light absorption element 30 gradually decrease. As shown in FIG. 4d, in some embodiments, the light absorption element 30 includes a plurality of sub-light absorption elements, and FIG. 4d shows a first sub-light absorption element 301, a second sub-light absorption element 302 and a third sub-light absorption element 303 sequentially provided in a direction away from the light source 201; the first sub-light absorption element 301, the second sub-light absorption element 302 and the third sub-light absorption element 303 respectively include a plurality of discrete portions arranged around the light source 201. For example, from the position close to the light source 201 to the position away from the light source 201, the light absorption rates of the sub-light absorption elements of the light absorption element 30 gradually decrease; each sub-light absorption element includes the plurality of discrete portions provided around the light source 201 with the light source 201 as a circle center, and the light absorption rates of the discrete portions in each sub-light absorption element are the same.

The light emission assembly provided by the embodiments of the present disclosure for example is used in cooperation with a single optical film or multiple optical films, or is not used in cooperation with any optical diaphragm, which will not be limited by the embodiments of the present disclosure.

With respect to position arrangement of the light absorption element 30, at a position where the light emission intensity is larger than an average value within the light emission angle (for example, −80° to 80°) in the case where the light absorption element 30 is not provided, the light absorption element 30 is provided; however, the embodiments of the disclosure are not limited thereto. For example, the light absorption element 30 is provided close to the light source 201 and up to an edge of the lens 202. Further, for example, the light absorption element 30 is provided within a range of a half of a diameter of the lens 202 with the light source 201 as a circle center. Further, for example, the light absorption element 30 is provided within a range of a quarter of the diameter of the lens 202 with the light source 201 as the circle center.

With respect to a shape or a pattern of the light absorption element 30, a suitable shape or pattern is selected according to the light emission intensity of the light emission element. In the embodiments of the present disclosure, it is illustrated with the rectangular light source 201 and the annular light absorption element 30 as an example; however, the embodiments of the disclosure are not limited thereto, and the light absorption element 30 for example is a quadrilateral ring corresponding to the shape of the rectangular light source, which will not be limited in the embodiments of the present disclosure.

For example, the light absorption element 30 is arranged symmetrically around the light source 201. Thus, light emitted from the light emission unit becomes more uniform, but the embodiments of the present disclosure are not limited thereto.

The light absorption element 30 for example is formed by printing; for example, after the light absorption element 30 is printed on the circuit board, the light emission diode chip is bonded onto the circuit board; and in a case where the lens is provided, the lens is bonded onto the circuit board by an adhesive.

At least one embodiment of the present disclosure provides a backlight module, comprising any one of the above-described light emission assemblies.

For example, the backlight module is a backlight module of direct-lit type.

At least one embodiment of the present disclosure provides a display device, comprising any one of the above-described backlight modules.

The display device comprises, for example, a television, but is not limited thereto.

In the backlight module and the display device provided by the embodiments of the present disclosure, because they comprise any one of the light emission assemblies according to the embodiments of the present disclosure, a portion of light at the central portion of the light emission unit is absorbed by the light absorption element provided on the circuit board around the light source, which weakens the light emission intensity at the central portion of the light emission unit, so that the light emission intensity difference between the central portion and the edge portion of the light emission unit is very reduced. Further, the light emission intensity above the light source is reduced to be consistent or substantially consistent with the light emission intensity at the edge portion of the light emission unit, so as to weaken or eliminate the bright spot in light shadow of the display device, and enhance an overall quality of the image.

There are some points to be illustrated:

(1) Unless otherwise defined, in the embodiments of the present disclosure and the accompanying drawings, a same reference sign denotes a same meaning.

(2) Drawings of the embodiments of the present disclosure only refer to structures related with the embodiments of the present disclosure, and other structures may refer to general design.

(3) In order to make it clear, in the drawings for illustrating the embodiment of the present disclosure, a thickness of a layer or a region is magnified. It should be understood that, when elements such as a layer, a film, region or a substrate and the like are called to be "above" or "below" another element, the element may be directly located "on" or "beneath" the other element, or there may be an intermediate element.

(4) Without conflict, features in a same embodiment and different embodiments of the present disclosure may be combined with each other.

The above merely are specific embodiments of the present disclosure, and not intended to define the scope of the present disclosure. Any variations or replacements which can be easily thought of by those skilled in the art in the scope of the present disclosure all shall fall within the scope of protection of the present disclosure. Therefore, the scope of the present disclosure should be the scope of the following claims.

The present application claims priority of Chinese Patent Application No. 201610403665.6 filed on Jun. 7, 2016, the disclosure of which is incorporated herein by reference in its entirety as part of the present application.

The invention claimed is:

1. A light emission assembly of a backlight module, comprising:
   a back plate,
   at least one light emission unit, provided on the back plate, the light emission unit including a light source,
   a light absorption element, provided on the back plate, the light absorption element being provided around the light source, wherein,
   the light emission unit further includes a lens, and the lens is fixed onto the back plate and provided outside the light source; and
   an orthogonal projection of the light absorption element on the back plate falls within an orthogonal projection of the lens on the back plate, and is located outside of an orthogonal projection of the light source on the back plate.

2. The light emission assembly according to claim 1, wherein, a shape of the light absorption element includes a closed ring provided around the light source, to weaken light emission intensity at a central portion of the light emission unit.

3. The light emission assembly according to claim 1, wherein, the light absorption element includes a plurality of discrete portions provided around the light source, to weaken light emission intensity at a central portion of the light emission unit.

4. The light emission assembly according to claim 3, wherein, the plurality of discrete portions are radially arranged around the light source in a ray pattern.

5. The light emission assembly according to claim 3, wherein, light absorption rates of the plurality of discrete portions are equal to each other.

6. The light emission assembly according to claim 1, wherein, a light absorption rate of the light absorption element is a constant value.

7. The light emission assembly according to claim 1, wherein, the light absorption element is arranged symmetrically around the light source.

8. The light emission assembly according to claim 1, wherein, from a position close to the light source to a position away from the light source, light absorption rates of the light absorption element gradually decrease.

9. The light emission assembly according to claim 1, wherein, the light absorption element includes a plurality of sub-light absorption elements; and from a position close to the light source to a position away from the light source, light absorption rates of the plurality of sub-light absorption elements of the light absorption element gradually decrease.

10. The light emission assembly according to claim 1, wherein, the light absorption element includes at least one of a black substance, a brown substance, a blue substance, and a gray substance.

11. The light emission assembly according to claim 1, wherein, the lens includes a refractive lens.

12. The light emission assembly according to claim 1, wherein, the back plate is provided thereon with a reflective layer, and the light absorption element is provided on the reflective layer.

13. The light emission assembly according to claim 1, wherein, the back plate includes a printed circuit board, and the light source includes a light emission diode chip.

14. A backlight module, comprising the light emission assembly according to claim 1.

15. The backlight module according to claim 14, wherein, the backlight module includes a backlight module of direct-lit type.

16. A display device, comprising the backlight module according to claim 14.

17. The light emission assembly according to claim 1, wherein, at a position where light emission intensity is larger than an average value within light emission angle in a case where the light absorption element is not provided, the light absorption element is provided.

18. The light emission assembly according to claim 1, wherein, the light absorption element is provided within a range of a half of a diameter of the lens with the light source as a circle center.

19. The light emission assembly according to claim 1, wherein,
the light absorption element includes a plurality of closed rings with the light source as a center of the plurality of closed rings;
a light absorption rate of each of the plurality of closed rings is a constant value while from a position close to the light source to a position away from the light source, light absorption rates of the plurality of closed rings gradually decrease.

20. The light emission assembly according to claim 1, wherein,
the light absorption element includes a plurality of sub-light absorption elements;
the plurality of sub-light absorption elements comprises different materials so that from a position close to the light source to a position away from the light source, light absorption rates of the plurality of sub-light absorption elements gradually decrease.

* * * * *